US005739062A

United States Patent [19]
Yoshida et al.

[11] Patent Number: 5,739,062
[45] Date of Patent: Apr. 14, 1998

[54] METHOD OF MAKING BIPOLAR TRANSISTOR

[75] Inventors: Naohito Yoshida; Masayuki Sakai, both of Itami, Japan

[73] Assignee: Mitsubishi Denki Kabushiki Kaisha, Tokyo, Japan

[21] Appl. No.: 917,467

[22] Filed: Aug. 26, 1997

Related U.S. Application Data

[62] Division of Ser. No. 698,685, Sep. 4, 1996, abandoned, which is a continuation of Ser. No. 393,687, Feb. 24, 1995, abandoned.

[30] Foreign Application Priority Data

Mar. 4, 1994 [JP] Japan ................... 6-034040

[51] Int. Cl.$^6$ ........................... H01L 21/331
[52] U.S. Cl. ............... 438/320; 438/312; 438/604; 438/606
[58] Field of Search .................... 438/312, 604, 438/606, 165, 177, 180, 193, 197, 249; 257/197, 58

[56] References Cited

U.S. PATENT DOCUMENTS

| | | |
|---|---|---|
| 5,117,271 | 5/1992 | Comfort et al. . |
| 5,144,398 | 9/1992 | Morishita . |
| 5,159,423 | 10/1992 | Clark et al. . |
| 5,216,271 | 6/1993 | Takagi et al. ............... 29/163 |
| 5,272,095 | 12/1993 | Enquist et al. ............... 437/31 |
| 5,360,986 | 11/1994 | Candelaria ............... 257/183 |
| 5,389,554 | 2/1995 | Liu et al. ............... 438/312 |
| 5,440,152 | 8/1995 | Yamazaki ............... 257/197 |
| 5,530,273 | 6/1996 | Nakamura ............... 257/197 |
| 5,620,907 | 4/1997 | Jalali-Farahani et al. ............... 438/320 |

FOREIGN PATENT DOCUMENTS

| | | | |
|---|---|---|---|
| 63-107066 | 5/1988 | Japan | 257/197 |
| 63-050174 | 10/1988 | Japan | 257/198 |
| 2238631 | 9/1990 | Japan . | |
| 462931 | 2/1992 | Japan . | |
| 4-368177 | 12/1992 | Japan | 257/197 |

OTHER PUBLICATIONS

Tanoue et al., "A Heterojunction Bipolar Transistor With An Epitaxially Regrown Emitter", IEEE, 1992 pp. 4.5.1–4.5.4.

*Primary Examiner*—John Niebling
*Assistant Examiner*—Long Pham
*Attorney, Agent, or Firm*—Leydig, Voit & Mayer, Ltd.

[57] ABSTRACT

A method of fabricating a bipolar transistor includes successively growing a collector layer, a base layer, and a crystalline mask layer on a semiconductor substrate; forming an opening in the crystalline mask layer to expose a portion of the base layer; growing an emitter layer on the crystalline mask layer and on the base layer exposed in the opening of the mask layer; forming an emitter electrode on the emitter layer; removing part of the emitter layer using the emitter electrode as a mask; removing the crystalline mask layer; forming a first resist pattern for formation of base electrodes; forming base electrodes using the first resist pattern and the emitter electrode as masks; removing the first resist pattern; forming a second resist pattern for formation of collector electrodes covering base electrodes and the emitter electrode; using the second resist pattern as a mask, removing portions of the base layer and the collector layer; and forming collector electrodes in contact with the collector layer.

12 Claims, 13 Drawing Sheets

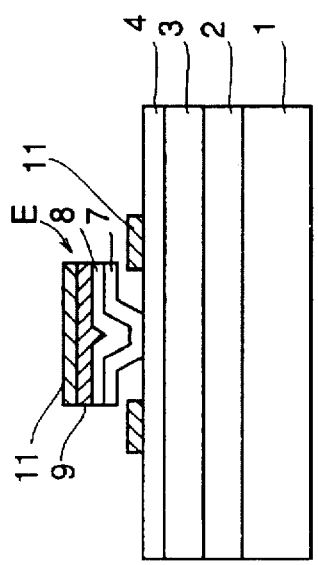
Fig.2 (e)
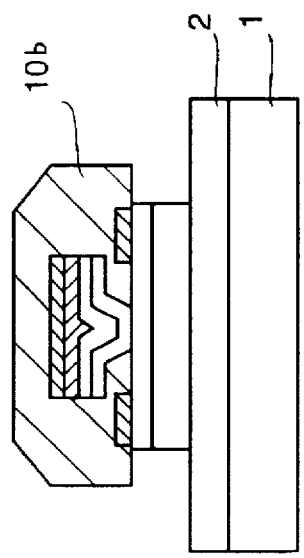
Fig.2 (f)
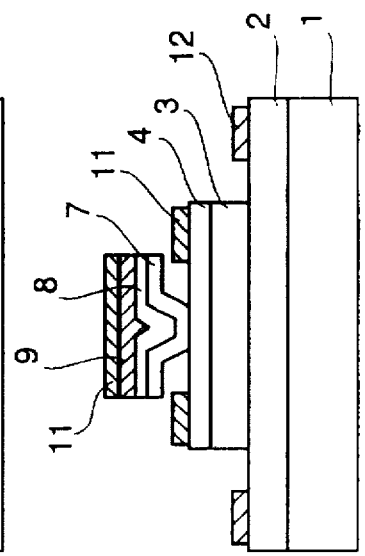
Fig.2 (g)
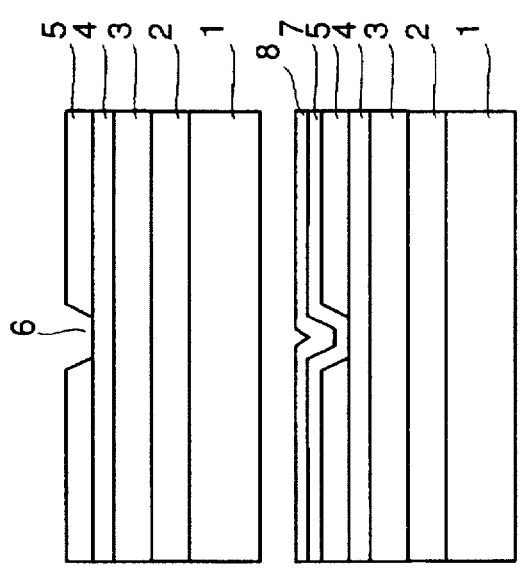
Fig.2 (a)
Fig.2 (b)
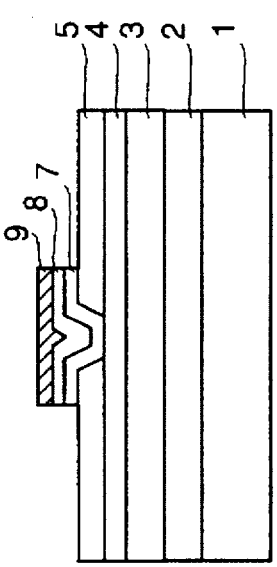
Fig.2 (c)
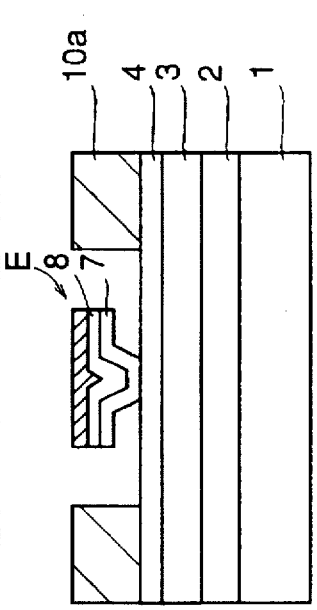
Fig.2 (d)

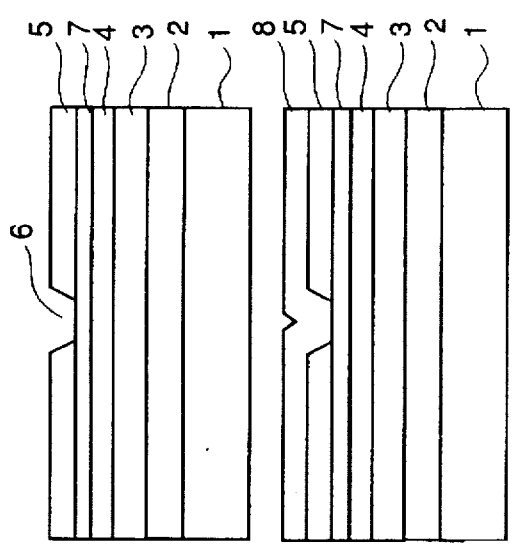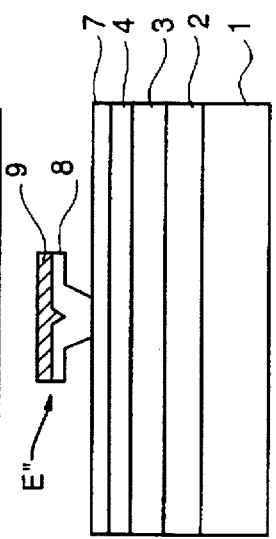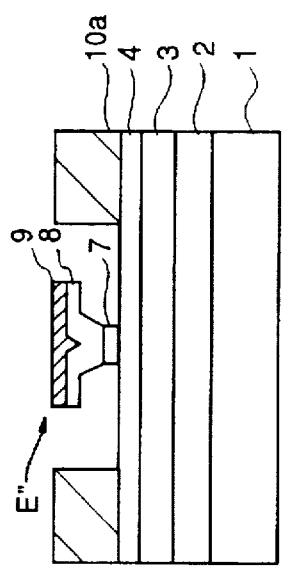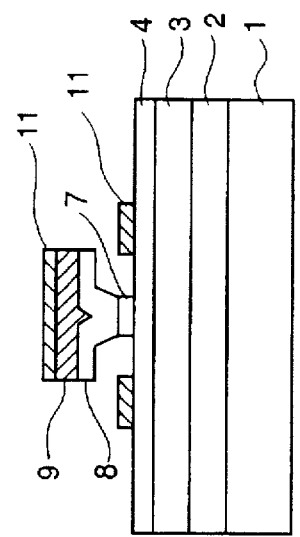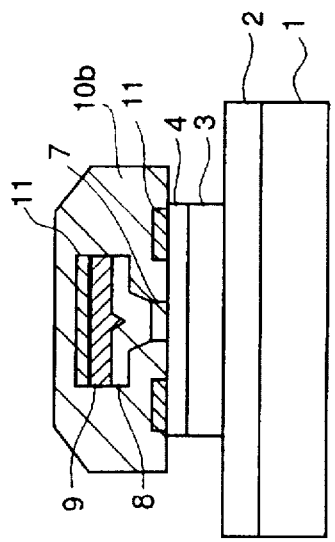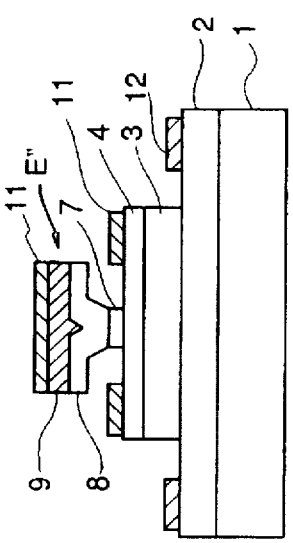
Fig.6 (a) Fig.6 (b) Fig.6 (c) Fig.6 (d) Fig.6 (e) Fig.6 (f) Fig.6 (g)

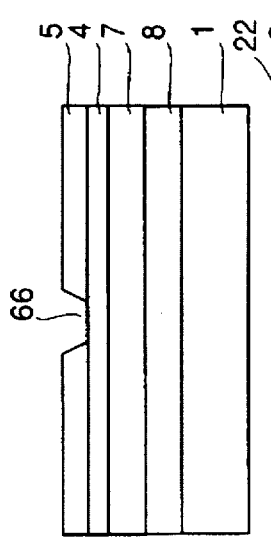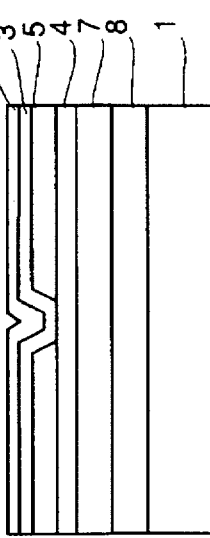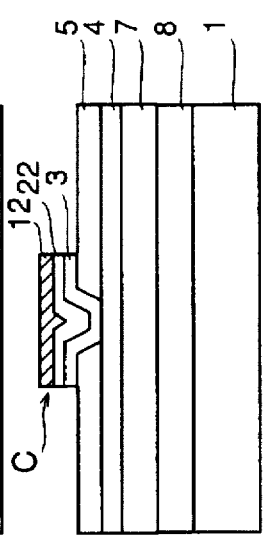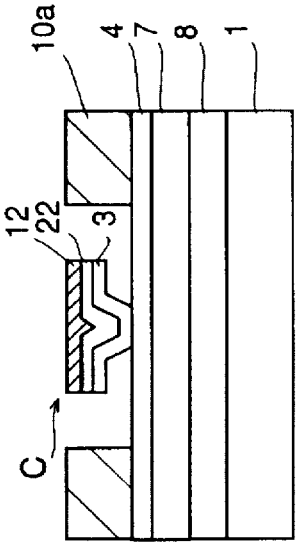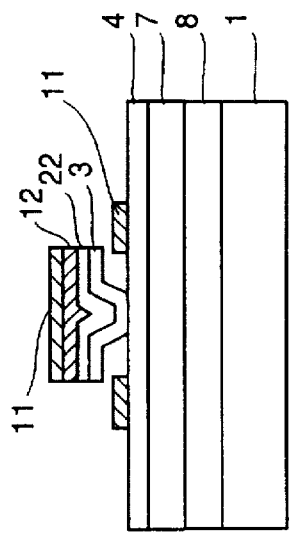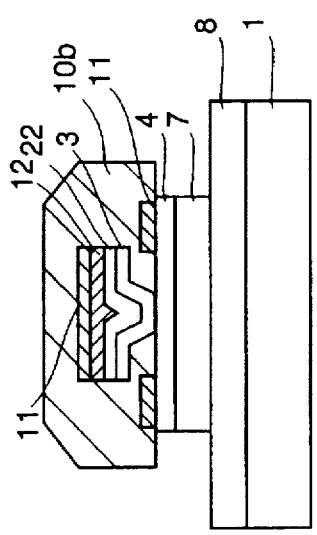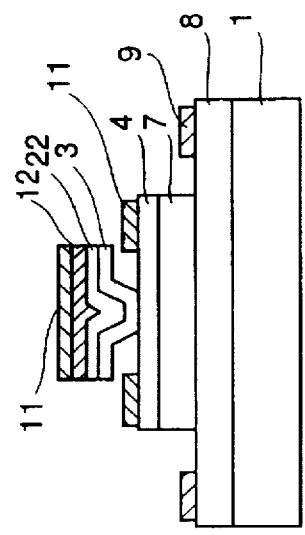
Fig.8 (a) Fig.8 (b) Fig.8 (c) Fig.8 (d) Fig.8 (e) Fig.8 (f) Fig.8 (g)

METHOD OF MAKING BIPOLAR TRANSISTOR

This disclosure is a division of patent application Ser. No. 08/698,685, filed Sep. 4, 1996, now abandoned which is a continuation of patent application Ser. No. 08/393,687, filed Feb. 24, 1995 and now abandoned.

FIELD OF THE INVENTION

The present invention relates to a bipolar transistor and, more particularly, to a heterojunction bipolar transistor (hereinafter referred to as an HBT) and a fabrication method thereof.

BACKGROUND OF THE INVENTION

FIG. 13 is a sectional view illustrating a prior art HBT. In the figure, reference numeral 1 designates a semi-insulating GaAS substrate having a thickness of 500 μm before grinding. An n type GaAs collector contact layer 2 having a dopant concentration of $2 \times 10^{18}$ cm$^{-3}$ and a thickness of 5000 Å is disposed on the GaAs substrate 1. An n type GaAs collector layer 3 having a dopant concentration of $5 \times 10^{16}$ cm$^{-3}$ and a thickness of 5000 Å is disposed on a center part of the collector contact layer 2. A p type GaAs base layer 4 having a dopant concentration of $4 \times 10^{19}$ cm$^{-3}$ and a thickness of 1000 Å is disposed on the collector layer 3. An n type $Al_xGa_{1-x}As$ (x=0.25) emitter layer 7 having a dopant concentration of $5 \times 10^{17}$ cm$^{-3}$ and a thickness of 2000 Å is disposed on a center part of the p type GaAs base layer 4. An n type InGaAs emitter contact layer 8 having a dopant concentration of $5 \times 10^{19}$ cm$^{-3}$ and a thickness of 500 Å is disposed on the emitter layer 7. An emitter electrode 9 is disposed on the emitter contact layer 8. Preferably, the emitter electrode 9 comprises a laminated structure of Ti(500 Å)/Mo(500 Å)/Au(4000 Å). The emitter layer 7, the emitter contact layer 8, and the emitter electrode 9 are 2 μm wide and 20 μm long. Base electrodes 11 are disposed on the p type GaAs base layer 4 at opposite sides of and spaced apart from the emitter layer 7. Preferably, the base electrodes 11 comprise Ti(500 Å)/Mo(500 Å)/Au(4000 Å). Collector electrodes 12 are disposed on the collector contact layer 2 at opposite sides of and spaced apart from the collector layer 3. Preferably, the collector electrodes 12 comprise AuGe (500 Å)/Ni(200 Å)/Au(2000 Å).

A description is given of the operation.

The emitter electrode 9 is grounded and a forward bias is applied across the collector electrodes 12 and the base electrodes 11. In this state, when a base current is modulated, a collector current that is several tens to several hundreds of times as large as the base current flows according to the base current, and the HBT operates. It is well known that HBTs are superior in high frequency and high speed operation to conventional bipolar transistors. The performance of HBTs depends on the emitter resistance and the collector resistance, and the gain characteristics are improved as these resistances are reduced. In addition, the gain characteristics are improved as the junction area between the base layer and the emitter layer and the junction area between the base layer and the collector layer are reduced.

Generally, in HBTs, since the emitter resistance depends on the contact resistance of the emitter electrode, the area of the emitter electrode is desired to be large. However, in the prior art HBT structure shown in FIG. 13, the junction area of the base layer 4 and the emitter layer 7 is equal to the junction area of the emitter layer 7 and the emitter electrode 9. Therefore, it is difficult to realize an HBT with reduced base-emitter junction area and reduced emitter resistance.

SUMMARY OF THE INVENTION

It is an object of the present invention to provide a bipolar transistor having a large emitter electrode area and a small emitter-base junction area, and a bipolar transistor having a large collector electrode area and a small collector-base junction area.

It is another object of the present invention to provide relatively simple methods for fabricating the above-described bipolar transistors.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a bipolar transistor includes a collector layer disposed on a semiconductor substrate, a base layer disposed on the collector layer, an emitter layer disposed on the base layer and including a portion having a T-shaped cross section, and an emitter electrode disposed on the top of the T-shaped portion of the emitter layer. Therefore, the area of the emitter electrode is increased while the junction area of the emitter layer and the base layer is reduced. As a result, a high performance bipolar transistor is realized.

According to a second aspect of the present invention, a bipolar transistor includes a collector layer disposed on a semiconductor substrate, a base layer disposed on the collector layer, an emitter layer disposed on the base layer and having a T-shaped cross section, and an emitter electrode disposed on the top of the T-shaped emitter layer. Therefore, the area of the emitter electrode is increased while the junction area of the emitter layer and the base layer is reduced. As a result, a high performance bipolar transistor is realized.

According to a third aspect of the present invention, a bipolar transistor includes a collector layer disposed on a semiconductor substrate, a base layer disposed on the collector layer, a first emitter layer disposed on the base layer, a second emitter layer disposed on the first emitter layer and having a T-shaped cross section, and an emitter layer disposed on the top of the T-shaped second emitter layer. Therefore, the area of the emitter electrode is increased while the junction area of the emitter layer and the base layer is reduced. As a result, a high performance bipolar transistor is realized.

According to a fourth aspect of the present invention, a bipolar transistor includes a collector layer disposed on a semiconductor substrate, a base layer disposed on the collector layer, an emitter layer disposed on the base layer, an emitter contact layer disposed on the emitter layer and having a T-shaped cross section, and an emitter electrode disposed on the top of the T-shaped emitter contact layer. Therefore, the area of the emitter electrode is increased while the junction area of the emitter layer and the base layer is reduced. As a result, a high performance bipolar transistor is realized.

According to a fifth aspect of the present invention, the above-described bipolar transistors are heterojunction bipolar transistors. Therefore, high performance heterojunction bipolar transistors with increased emitter electrode area and reduced emitter-base junction area are realized.

According to a sixth aspect of the present invention, in the above-described bipolar transistors, the collector layer is interchanged with the emitter layer. Therefore, high performance bipolar transistors with increased collector electrode area and reduced collector-base area are realized.

According to a seventh aspect of the present invention, a method of fabricating a bipolar transistor comprises successively growing a collector layer, a base layer, and a crystalline mask layer on a semiconductor substrate, forming an opening in the crystalline mask layer to expose a portion of the base layer, growing an emitter layer on the crystalline mask layer and on the base layer exposed in the opening of the mask layer, forming an emitter electrode on the emitter layer, selectively removing the emitter layer using the emitter electrode as a mask, selectively removing the crystalline mask layer, forming a first resist pattern for formation of base electrodes, forming base electrodes using the first resist pattern and the emitter electrode as masks, forming a second resist pattern for formation of collector electrodes covering the base electrodes and the emitter electrode after removal of the first resist pattern, removing prescribed portions of the base layer and the collector layer using the second resist pattern as a mask, and forming collector electrodes in contact with the collector layer. Therefore, a high performance bipolar transistor with increased emitter electrode area and reduced emitter-base junction area is fabricated using a relatively simple method.

According to an eighth aspect of the present invention, a method of fabricating a bipolar transistor includes successively growing a collector layer, a base layer, a first emitter layer, and a crystalline mask layer on a semiconductor substrate, forming an opening in the crystalline mask layer to expose a portion of the first emitter layer, growing a second emitter layer on the crystalline mask layer and on the first emitter layer exposed in the opening of the mask layer, forming an emitter electrode on the second emitter layer, selectively removing the second and first emitter layers using the emitter electrode as a mask, selectively removing the crystalline mask layer, forming a first resist pattern for formation of base electrodes, forming base electrodes using the first resist pattern and the emitter electrode as masks, forming a second resist pattern for formation of collector electrodes covering the base electrodes and the emitter electrode after removal of the first resist pattern, removing prescribed portions of the base layer and the collector layer using the second resist pattern as a mask, and forming collector electrodes in contact with the collector layer. Therefore, a high performance bipolar transistor with increased emitter electrode area and reduced emitter-base junction area is fabricated using a relatively simple method.

According to a ninth aspect of the present invention, a method of fabricating a bipolar transistor includes successively growing a collector layer, a base layer, an emitter layer, and a crystalline mask layer on a semiconductor substrate, forming an opening in the crystalline mask layer to expose a portion of the emitter layer, growing an emitter contact layer on the crystalline mask layer and on the emitter layer exposed in the opening of the mask layer, forming an emitter electrode on the emitter contact layer, selectively removing the emitter contact layer using the emitter electrode as a mask, selectively removing the crystalline mask layer, forming a first resist pattern for formation of base electrodes, forming base electrodes using the first resist pattern and the emitter electrode as masks, forming a second resist pattern for formation of collector electrodes covering the base electrodes and the emitter electrode after removal of the first resist pattern, removing prescribed portions of the base layer and the collector layer using the second resist pattern as a mask, and forming collector electrodes in contact with the collector layer. Therefore, a high performance bipolar transistor with increased emitter electrode area and reduced emitter-base junction area is fabricated using a relatively simple method.

According to a tenth aspect of the present invention, the above-described bipolar transistors are heterojunction bipolar transistors. Therefore, according to the above-described fabrication methods, high performance heterojunction bipolar transistors with increased emitter electrode area and reduced emitter-base junction area are fabricated.

According to an eleventh aspect of the present invention, using a above-described fabrication methods of bipolar transistors, the collector layer is interchanged with the emitter layer. Therefore, high performance heterojunction bipolar transistors with increased collector electrode area and reduced collector-base junction area are fabricated.

BRIEF DESCRIPTION OF THE DRAWINGS

FIGS. 2(a)–2(g) are sectional views illustrating process steps in a method of fabricating the HBT of FIG. 1.

FIGS. 6(a)–6(g) are sectional views illustrating process steps in a method of fabricating the HBT of FIG. 5.

FIGS. 8(a)–8(g) are sectional views illustrating process steps in a method of fabricating the HBT of FIG. 7.

DETAILED DESCRIPTION OF THE PREFERRED EMBODIMENTS

Embodiment 1

Figure 1:
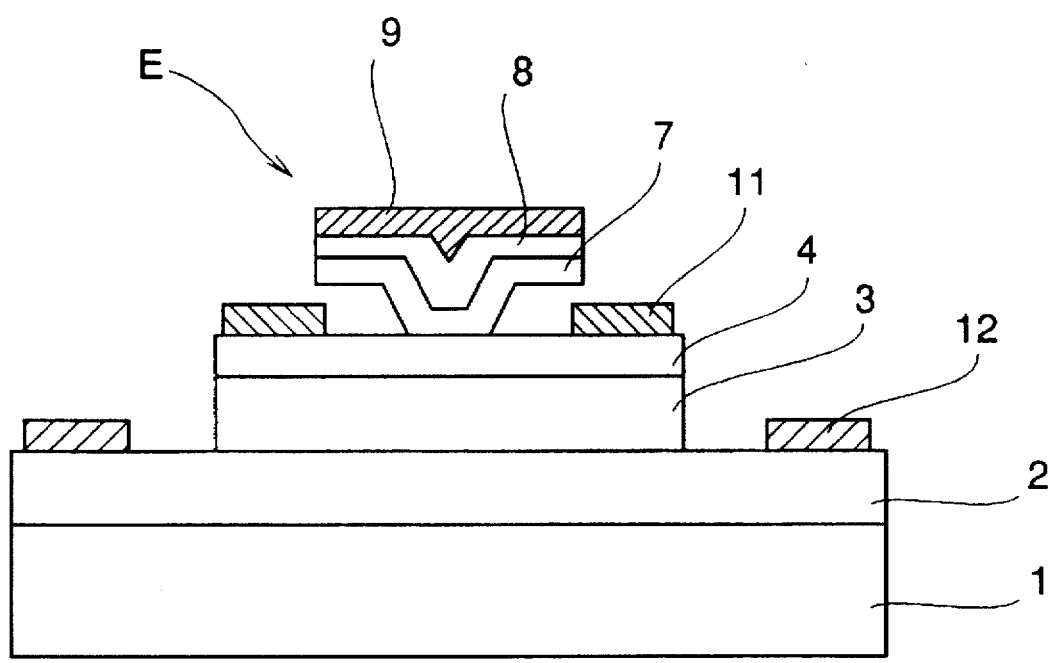
FIG. 1 is a sectional view illustrating an HBT according to a first embodiment of the present invention.

FIG. 1 is a sectional view illustrating an HBT according to a first embodiment of the present invention. FIGS. 2(a)–2(g) are sectional views illustrating process steps in a method of fabricating the HBT of FIG. 1.

In FIG. 1, reference numeral 1 designates a semi-insulating GaAs substrate having a thickness of 500 μm before grinding. An n type GaAs collector contact layer 2 having a dopant concentration of $2 \times 10^{18}$ cm$^{-3}$ and a thickness of 5000 Å is disposed on the GaAs substrate 1. An n type GaAs collector layer 3 having a dopant concentration of $5 \times 10^{16}$ cm$^{-3}$ and a thickness of 5000 Å is disposed on a center part of the collector contact layer 2. A p type GaAs base layer 4 having a dopant concentration of $4 \times 10^{19}$ cm$^{-3}$ and a thickness of 1000 Å is disposed on the collector layer 3. The p type dopant is carbon (C). An n type Al$_x$Ga$_{1-x}$As (x=0.25) emitter layer 7 having a dopant concentration of $5\times10^{17}$ cm$^{-3}$ and a thickness of 2000 Å is disposed on a center part of the p type GaAs base layer 4. An n type In$_x$Ga$_{1-x}$As emitter contact layer 8 having a dopant concentration of $5\times10^{19}$ cm$^{-3}$ and a thickness of 500 Å is disposed on the emitter layer 7. The In composition ratio x of the In$_x$Ga$_{1-x}$As emitter contact layer 8 increases upwards in the orientation of figure from 0 to 0.5. An emitter electrode 9 is disposed on the emitter contact layer 8. Preferably, the emitter electrode 9 comprises a laminated structure of Ti(500 Å)/Mo(500 Å)/Au(4000 Å). An emitter structure E having a T-shaped cross-section comprises the emitter layer 7, the emitter contact layer 8, and the emitter electrode 9. The width of the junction area between the emitter layer 7 and the based layer 4 is 2 μm. The width of an upper part of the T-shaped emitter structure E is 8 μm. Base electrodes 11 are disposed on the p type GaAs based layer 4 at opposite sides of and spaced apart from the emitter layer 7. Preferably, the based electrodes 11 comprise Ti(500 Å)/Mo (500 Å)/Au(4000 Å). Collector electrodes 12 are disposed on the collector contact layer 2 at opposite sides of and spaced apart from the collector layer 3. Preferably, the collector electrodes 12 comprise AuGe(500 Å)/Ni(200 Å)/Au(2000 Å).

In FIGS. 2(a)–2(g), reference numeral 5 designates an Al$_x$Ga$_{1-x}$As (x=0.5) mask layer having an opening 6 for connecting the emitter layer 7 to the based layer 4.

The fabrication process of the HBT shown in FIG. 1 will be described hereinafter.

Initially, as illustrated in FIG. 2(a), there are successively grown on the semi-insulating GaAs substrate 1 the collector contact layer 2, the collector layer 3, the based layer 4, and the crystalline mask layer 5, preferably by MOCVD (Metal Organic Chemical Vapor Deposition). The mask layer 5 comprises AlGaAs having a relatively high Al composition ratio. In this embodiment, the Al composition ratio is 0.5. Then, a prescribed portion of the mask layer 5 is selectively removed by photolithography and wet etching with a hydrofluoric acid based etchant, forming an opening 6 having a width of 2 μm. The etching of the mask layer 5 may be performed by dry etching.

Thereafter, as illustrated in FIG. 2(b), the emitter layer 7 and the emitter contact layer 8 are grown over the entire surface of the wafer by MOCVD.

In the step of FIG. 2(c), the emitter electrode 9 having a prescribed area is formed on the emitter contact layer 8 and, using the emitter electrode 9 as a mask, the emitter contact layer 8 and the emitter layer 7 are selectively etched-with a tartaric acid or citric acid based etchant.

In the step of FIG. 2(d), the AlGaAs mask layer 5 is etched away with a hydrofluoric acid based etchant, resulting in the emitter structure E having a T-shaped cross-section. If the mask layer 5 comprises an insulating film, the emitter layer 7 grown on the insulating mask layer is unfavorably converted into a polycrystalline layer, whereby the resistance of the emitter layer 7 is increased. In this case, the emitter resistance cannot be reduced, and the precision in patterning of the mask layer is reduced. In this first embodiment of the invention, however, since a crystalline film is used as the mask 5, a monocrystalline emitter layer is grown thereon.

In the step of FIG. 2(d), using photolithographic techniques, a resist pattern 10a having an opening opposite a region where the T-shaped emitter structure E is present and based electrodes are to be located is formed on the based layer 4.

Using the resist pattern 10a and the T-shaped emitter structure E as masks, a based metal is deposited over the wafer, and portions of the based metal on the resist pattern 10a are removed by the lift-off technique, thereby forming based electrodes 11 (FIG. 2(e)).

In the step of FIG. 2(f), a resist pattern 10b is formed on the based layer 4, covering the emitter structure E and the based electrodes 11. Using the resist pattern 10b as a mask, the based layer 4 and the collector layer 3 are selectively etched away, followed by vapor deposition and lift-off of a metal layer to form collector electrodes 12 (FIG. 2 (g)). As described above, since an HBT structure according to the first embodiment of the invention includes the T-shaped emitter structure E, the junction area of the emitter electrode 9 and the emitter layer 7 is larger than the junction area of the emitter layer 7 and the based layer 4. Therefore, an HBT with reduced junction capacitance and reduced emitter resistance is realized.

Embodiment 2

Figure 3:
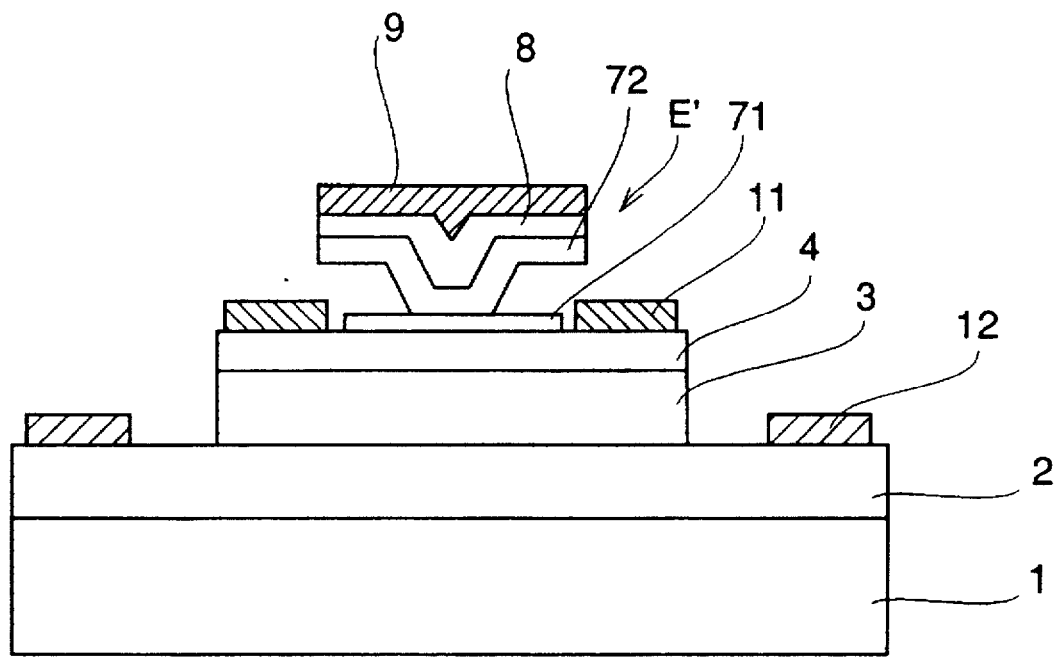
FIG. 3 is a sectional view illustrating an HBT according to a second embodiment of the present invention.

FIG. 3 is a cross-sectional view illustrating an HBT according to a second embodiment of the present invention. FIGS. 4(a)–4(h) are cross-sectional views illustrating process steps in a method of fabricating the HBT of FIG. 3.

In FIG. 3, the same reference numerals as in FIG. 1 designate the same or corresponding parts. Physical parameters of the HBT, such as composition and thickness of the respective layers, according to this second embodiment are the same as those of the first embodiment. Reference numerals 71 and 72 designate first and second n type AlGaAs emitter layers having the same physical parameters as the n type Al$_x$Ga$_{1-x}$As emitter layer 7 of the first embodiment. Reference character E' designates an emitter structure.

In the above-described first embodiment, the T-shaped emitter structure E is fabricated by regrowing the emitter layer 7 and the emitter contact layer 8 after formation of the opening of the crystalline mask layer 5. In this second embodiment, however, the emitter structure E' includes the first emitter layer 71 and the second emitter layer 72, and the T-shaped part of the emitter structure' comprises the second emitter layer 72 and the emitter contact layer 8. Also in this structure, the same effects as described in the first embodiment are achieved.

In this case, however, the first emitter layer 71 must be sufficiently thin to deplete carriers using a exposed portion of the emitter layer 71. Preferably, the first emitter layer 71 is 300–500 Å thick.

Figure 4:
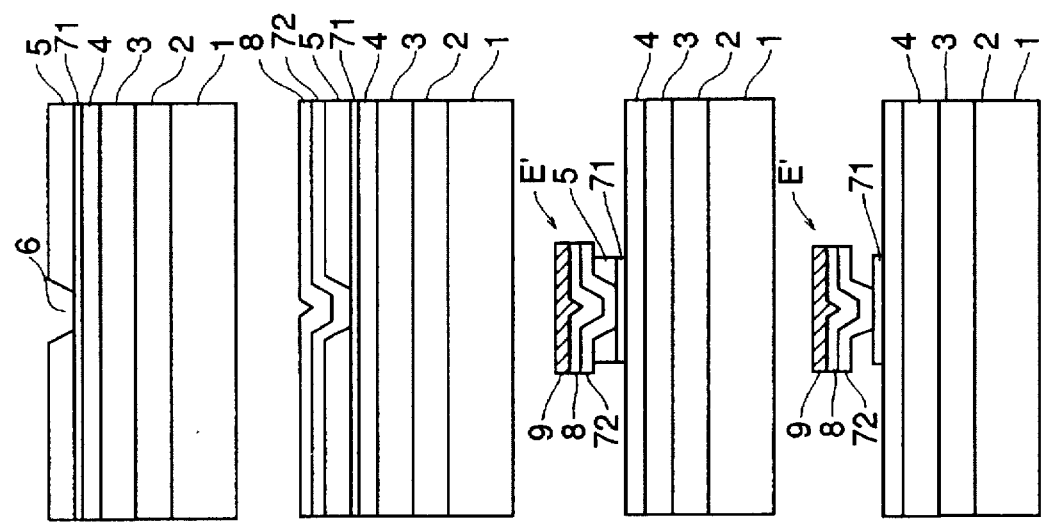
FIGS. 4(a)–4(h) are sectional views illustrating process steps in a method of fabricating the HBT of FIG. 3.

The process steps shown in FIGS. 4(a)–4(h) for fabricating the HBT shown in FIG. 3 are fundamentally identical to the process steps already described with respect to FIGS. 2(a)–2(g) except that the first emitter layer 71 is grown on the based layer 4 (FIG. 4(a)), followed by formation of the mask layer 5 on the first emitter layer 71, and the second emitter layer 72 and the emitter contact layer 8 are successively grown on the mask layer 5 (FIG. 4(c)).

In an HBT according to this second embodiment of the invention, since the emitter structure E' a has a T-shaped cross-section, the junction area of the eitter electrode 9 and the second emitter layer 72 is larger than the junction area of the second emitter layer 72 and the based layer 4, resulting in an HBT with reduced contact capacitance and reduced emitter resistance.

Further, the HBT is easily fabricated according to the process steps shown in FIGS. 4(a)–4(h).

Embodiment 3

Figure 5:
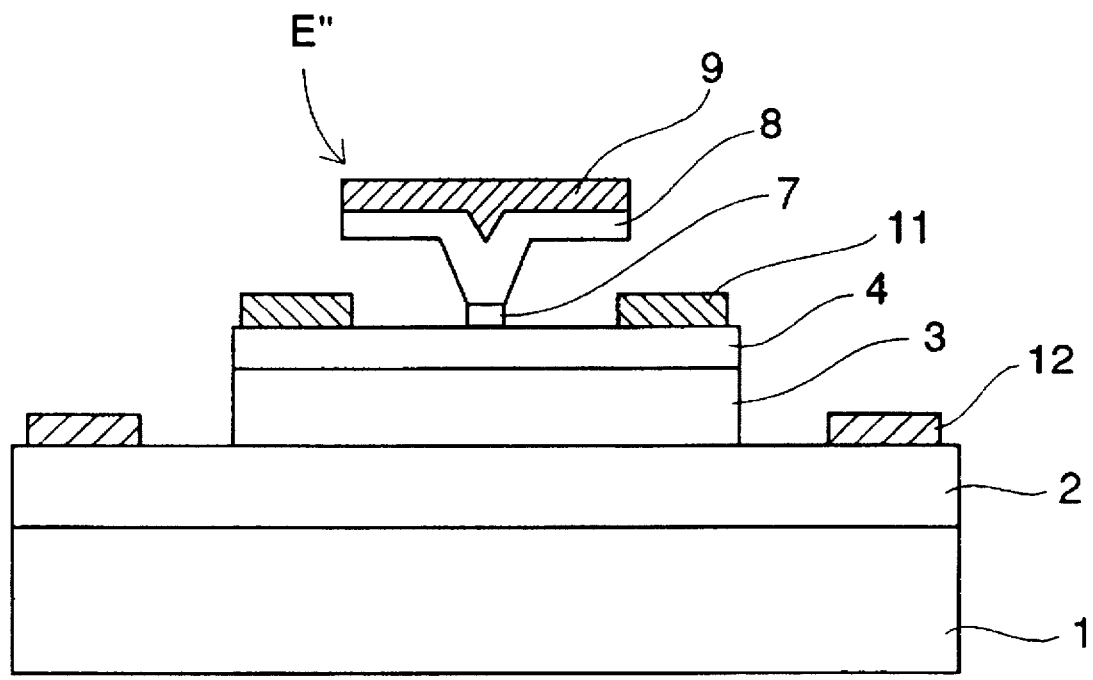
FIG. 5 is a sectional view illustrating an HBT according to a third embodiment of the present invention.

FIG. 5 is a cross-sectional view illustrating an HBT according to a third embodiment of the present invention. In FIG. 5, the same reference numerals as in FIG. 1 designate the same or corresponding parts, and the physical parameters, such as composition and thickness, are the same as those described with respect to FIG. 1.

In the HBT shown in FIG. 5, only the emitter contact layer 8 has a T-shaped cross-section. Also in this case, the same effects as described using a first embodiment are achieved.

FIGS. 6(a)–6(g) are cross-sectional views illustrating process steps in a method of fabricating the HBT shown in FIG. 5. In this fabrication method, as shown in FIG. 6(a), the emitter layer 7 is grown on the based layer 4, followed by formation of the crystalline mask layer 5. Then, the emitter contact layer 8 is grown (FIG. 6(b)) and the emitter electrode 9 having a prescribed width is formed on the emitter contact layer 8. Using the emitter electrode 9 as a mask, the emitter contact layer 8 is selectively etched, followed by removal of the mask layer 5 (FIG. 6(c)). As a result, a T-shaped emitter structure E" comprising the n type AlGaAs emitter contact layer 8 and the emitter electrode 9 is fabricated. Thereafter, using a step illustrated in FIG. 6(d), the emitter layer 7 is selectively etched using the emitter contact layer 8 and the emitter electrode 9 as masks, and a resist pattern 10a is formed on the based layer 4 by photolithographic techniques. The resist pattern 10a has an opening in a region where the T-shaped emitter structure E" is located.

The process steps shown in FIGS. 6(e)–6(g) are identical to those already described with respect to FIGS. 2(e)–2(g) and, therefore, do not require repeated description.

In an HBT according to the third embodiment of the invention, since the emitter structure E" has a T-shaped cross-section, the contact area of the emitter electrode 9 and the emitter contact layer 8 is larger than the junction area of the emitter contact layer 8 and the based layer 4, resulting in an HBT with reduced contact capacitance and reduced emitter resistance.

Further, the HBT is easily fabricated according to the process steps shown in FIGS. 6(a)–6(g).

Embodiment 4

Figure 7:
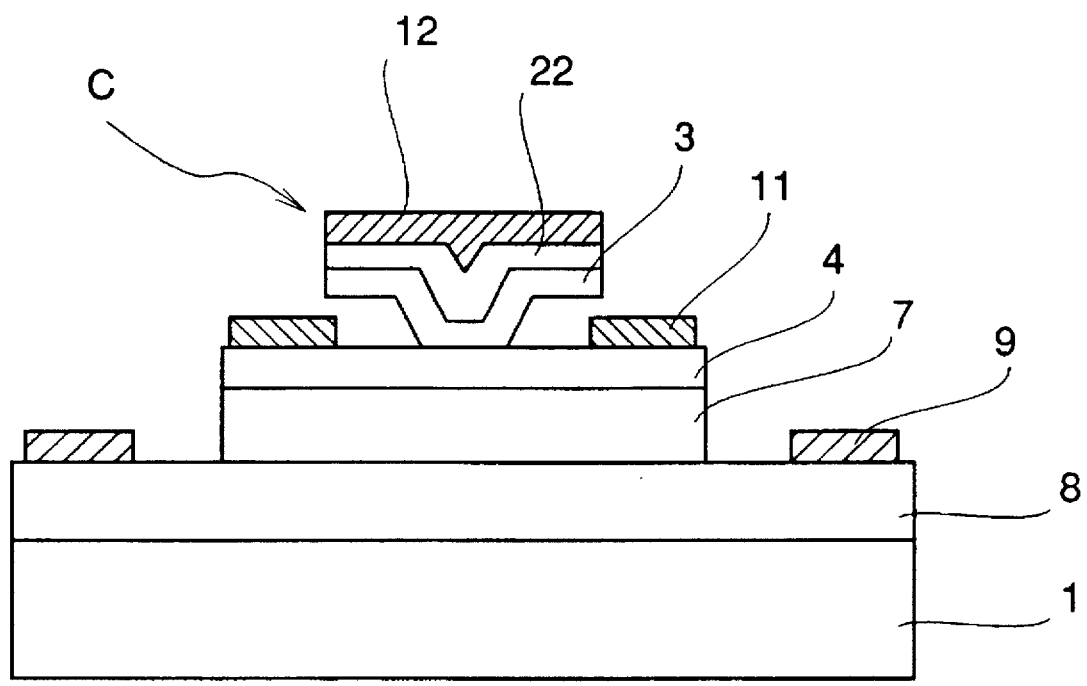
FIG. 7 is a sectional view illustrating an HBT according to a fourth embodiment of the present invention.

FIG. 7 is a cross-sectional view illustrating an HBT according to a fourth embodiment of the present invention. In FIG. 7, the same reference numerals as in FIG. 1 designate the same or corresponding parts, and the physical parameters, such as composition and thickness, are the same as those described with respect to FIG. 1.

In the above-described first embodiment of the invention, emphasis has been placed upon a structure including an emitter contact layer at the top of the laminated semiconductor layers. In this fourth embodiment, an HBT including a collector contact layer at the top of the laminated structure will be described. In FIG. 7, reference numeral 22 designates an n type $In_xGa_{1-x}As$ collector contact layer having the same physical parameters as the n type $In_xGa_{1-x}As$ emitter contact layer 8 shown in FIG. 1.

The structure of the HBT shown in FIG. 7 is fundamentally identical to the structure of the first embodiment shown in FIG. 1 except that the collector layer 3 and the emitter layer 7 are interchanged with each other. That is, the emitter structure E shown in FIG. 1 is interchanged with a collector structure C comprising an n type GaAs collector layer 3, an n type InGaAs collector contact layer 22, and a collector electrode 12.

FIGS. 8(a)–8(g) are cross-sectional views illustrating process steps in a method of fabricating the HBT shown in FIG. 7. The process steps shown in FIGS. 8(a)–8(g) are fundamentally identical to the process steps according to the first embodiment shown in FIGS. 2(a)–2(g) except that the emitter structure E of the first embodiment is interchanged with the collector structure C.

Initially, as illustrated in FIG. 8(a), an emitter contact layer 8, an emitter layer 7, a based layer 4, and a crystalline mask layer 5 are successively grown on a semi-insulating GaAs substrate 1, preferably by MOCVD. The mask layer 5 comprises AlGaAs having a relatively high Al composition ratio. In this case, the Al composition ratio is 0.5. Then, an opening 66 having a width of 2 μm is formed using a mask layer 5 by photolithography and wet etching with a hydrofluoric acid based etchant. Alternatively, this etching may be a dry etching.

In the step of FIG. 8(b), a collector layer 3 and a collector contact layer 22 are grown over the entire surface of the wafer by MOCVD so that the collector layer 3 contacts the based layer 4 at the bottom of the opening 66 of the mask layer 5.

In the step of FIG. 8(c), a collector electrode 12 having a prescribed area is formed on the collector contact layer 22 and, using the collector electrode 12 as a mask, the collector layer 3 and the collector contact layer 22 are selectively etched with a tartaric acid or citric acid based etchant.

In the step of FIG. 8(d), the mask layer 5 is removed with a hydrofluoric acid based etchant, resulting in a T-shaped collector structure C. If the mask layer 5 comprises an insulating film, the collector layer 3 grown on the insulating mask layer is converted into a polycrystalline layer, so that the resistance of the collector layer 3 is unfavorably increased. In this case, the collector resistance cannot be reduced, and the precision in patterning of the mask layer is reduced. In this fourth embodiment of the invention, however, since a crystalline film is used as the mask 5, a monocrystalline collector layer is grown thereon. Thereafter, a resist pattern 10a having an opening in a region where the T-shaped collector structure C is present and based electrodes are to be formed is formed on the based layer 4 by photolithographic techniques.

In the step of FIG. 8(e), using the resist pattern 10a and the T-shaped collector structure C as masks, a based metal is deposited, and the resist pattern 10a and unnecessary portions of the based metal on the resist pattern 10a are removed by the lift-off technique, whereby based electrodes 11 are fabricated.

Thereafter, a resist pattern 10b is formed on the based layer 4, covering the collector structure C and the based electrodes 11. Using the resist pattern 10b as a mask, the based layer 4 and the emitter layer 7 are selectively etched as shown in FIG. 8(f). Then, as shown in FIG. 8(g), a metal is deposited using the resist pattern 10b as a mask, and the resist pattern 10b and unnecessary portions of the metal on the resist pattern 10b are removed by the lift-off technique, thereby forming emitter electrodes 9.

In an HBT according to this fourth embodiment of the invention, since the collector structure C has a T-shaped cross-section, the contact area of the collector electrode 12 and the collector contact layer 22 is larger than the junction area of the collector layer 3 and the based layer 4, whereby an HBT with reduced contact capacitance and reduced collector resistance is realized.

Further, the HBT is easily fabricated according to the process steps shown in FIGS. 8(a)–8(g).

Embodiment 5

Figure 9:
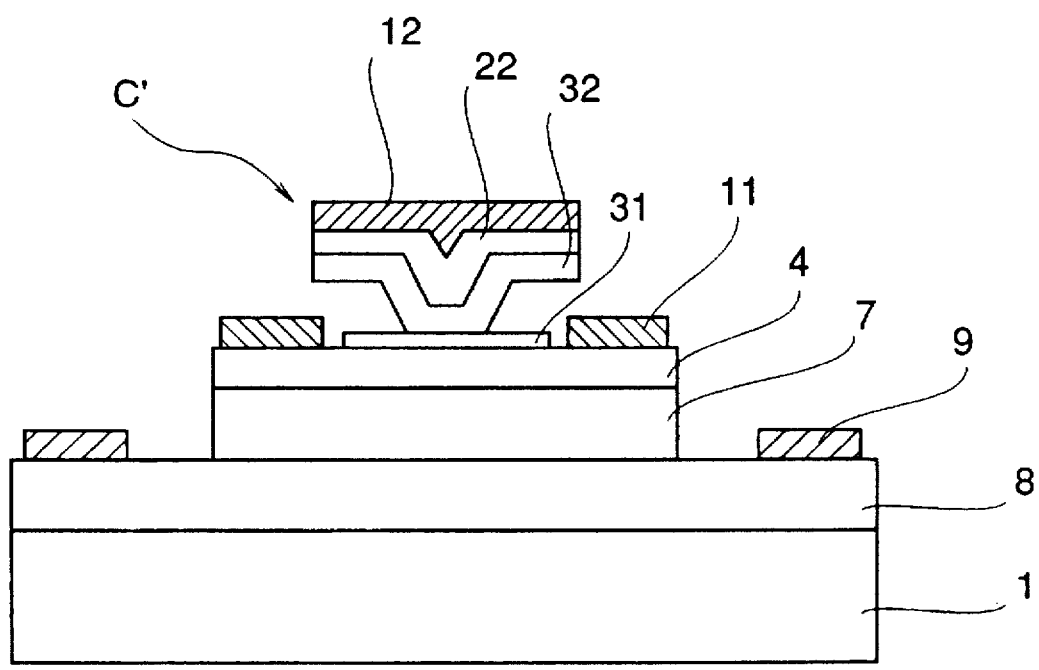
FIG. 9 is a sectional view illustrating an HBT according to a fifth embodiment of the present invention.

FIG. 9 is a cross-sectional view illustrating an HBT in accordance with a fifth embodiment of the present invention. In the figure, the same reference numerals as in FIG. 3 designate the same or corresponding parts, and the physical parameters, such as composition and thickness, are the same as those described with respect to FIG. 3.

In the above-described second embodiment, emphasis has been placed upon a structure including an emitter layer at the top of the laminated semiconductor layers. In this fifth embodiment, a similar HBT structure including a collector contact layer at the top of the laminated structure will be described. In FIG. 9, reference numeral 31 designates a first n type GaAs collector layer, and numeral 32 designates a second n type GaAs collector layer. These first and second collector layers 31 and 32 have the same physical parameters as the collector layer 3 shown in FIG. 3. Reference numeral 22 designates an n type $In_xGa_{1-x}As$ collector contact layer having the same physical parameters as the n type $In_xGa_{1-x}As$ emitter contact layer 8 shown in FIG. 3. Further, reference character C' designates a collector structure comprising the second n type GaAs collector layer 32, the n type InGaAs collector contact layer 22, and the collector electrode 12.

The fabrication process of the HBT shown in FIG. 9 is illustrated in FIGS. 10(a)–10(h). The process steps shown in FIGS. 10(a)–10(h) are fundamentally identical to the process steps according to the second embodiment shown in FIGS. 4(a)–4(h) except that the emitter structure E' is interchanged with the collector structure C'.

Figure 10:
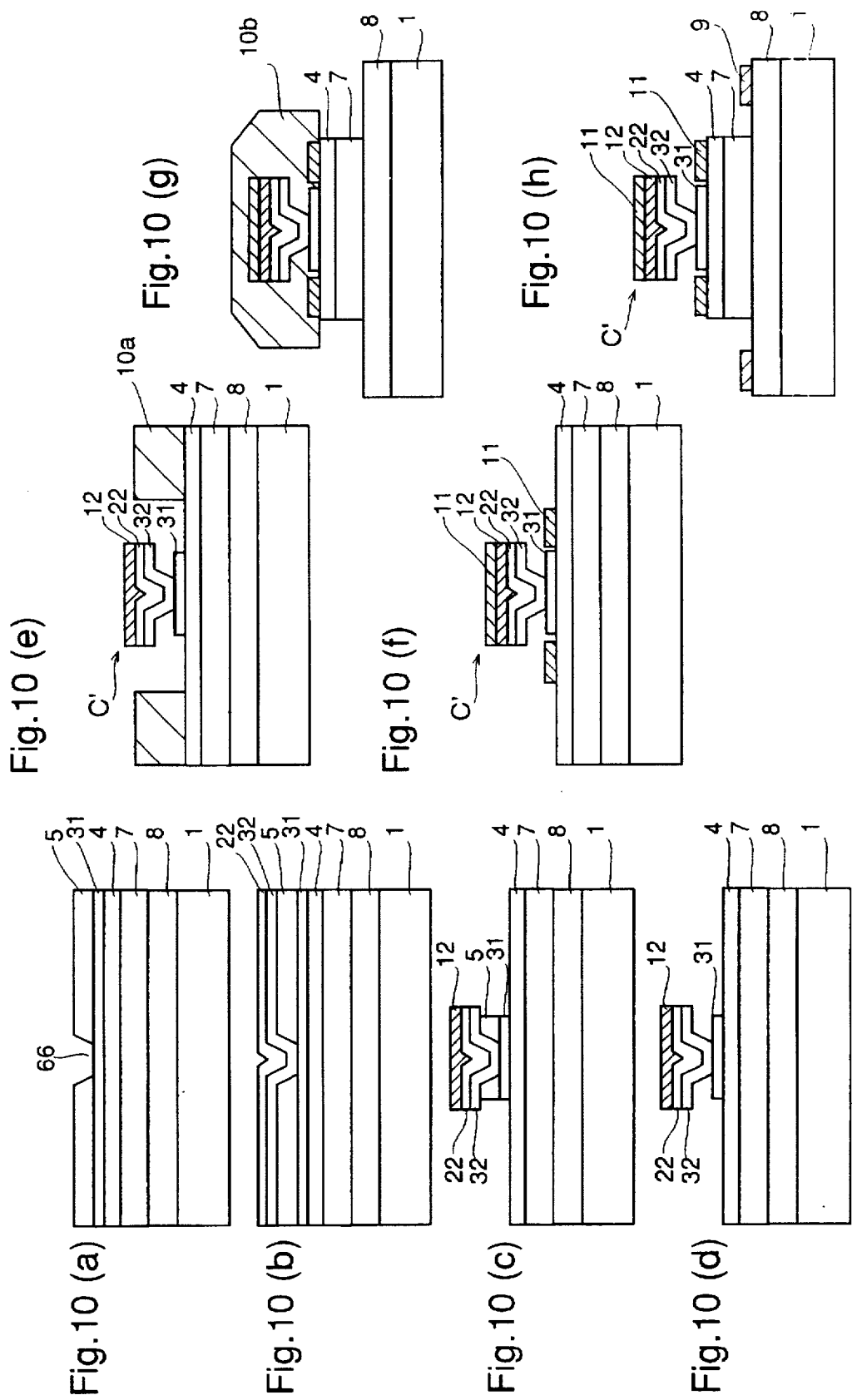
FIGS. 10(a)–10(h) are sectional views illustrating process steps in a method of fabricating the HBT of FIG. 9.

Initially, as illustrated in FIG. 10(a), an emitter contact layer 8, an emitter layer 7, a based layer 4, a first collector layer 31, and a crystalline mask layer 5 are successively grown on a semi-insulating GaAs substrate 1 by MOCVD. The mask layer 5 comprises AlGaAs having a relatively high Al composition ratio. In this case, the Al composition ratio is 0.5. Then, an opening 66 having a width of 2 µm is formed using a mask layer 5 by photolithography and wet etching with a hydrofluoric acid based etchant. Alternatively, this etching may be a dry etching.

In the step of FIG. 10(b), a second collector layer 32 and a collector contact layer 22 are grown over the entire surface of the wafer by MOCVD so that the second collector layer 32 contacts the first collector layer 31 at the bottom of the opening 66 of the mask layer 5.

In the step of FIG. 10(c), a collector electrode 12 having a prescribed area is formed on the collector contact layer 22 and, using the collector electrode 12 as a mask, the second collector layer 32, the collector contact layer 22, and the first collector layer 31 are selectively etched with a tartaric acid or citric acid based etchant.

In the step of FIG. 10(d), the mask layer 5 is removed with a hydrofluoric acid based etchant, resulting in a T-shaped collector structure C'. If the mask layer 5 comprises an insulating film, the collector layer 32 grown on the insulating mask layer is converted into a polycrystalline layer, so that the resistance of the collector layer 32 is unfavorably increased. In this case, the collector resistance cannot be reduced, and the precision in patterning of the mask layer is reduced. In this fifth embodiment of the invention, however, since a crystalline film is used as the mask 5, a monocrystalline collector layer is grown thereon.

Thereafter, as illustrated in FIG. 10(e), a resist pattern 10a having an opening in a region where the T-shaped collector structure C' is present and based electrodes are to be formed is formed on the based layer 4 by photolithographic techniques.

In the step of FIG. 10(f), a based metal is deposited using the resist pattern 10a and the T-shaped collector structure C' as masks, and the resist pattern 10a and unnecessary portions of the based metal on the resist pattern 10a are removed by the lift-off technique, whereby based electrodes 11 are fabricated.

Thereafter, as illustrated in FIG. 10(g), a resist pattern 10b is formed on the based layer 4, covering the collector structure C' and the based electrodes 11. Using the resist pattern 10b as a mask, the based layer 4 and the emitter layer 7 are selectively etched. Then, as illustrated in FIG. 10(h), a metal is deposited using the resist pattern 10b as a mask, and the resist pattern 10b and unnecessary portions of the metal on the resist pattern 10b are removed by the lift-off technique, thereby forming emitter electrodes 9.

In an HBT according to this fifth embodiment of the invention, since the collector structure C' has a T-shaped cross-section, the contact area of the collector electrode 12 and the collector contact layer 22 is larger than the junction area of the collector layer 32 and the based layer 4, resulting in an HBT with reduced contact capacitance and reduced collector resistance.

Further, the HBT is easily fabricated according to the process steps shown in FIGS. 10(a)–10(h).

Embodiment 6

Figure 11:
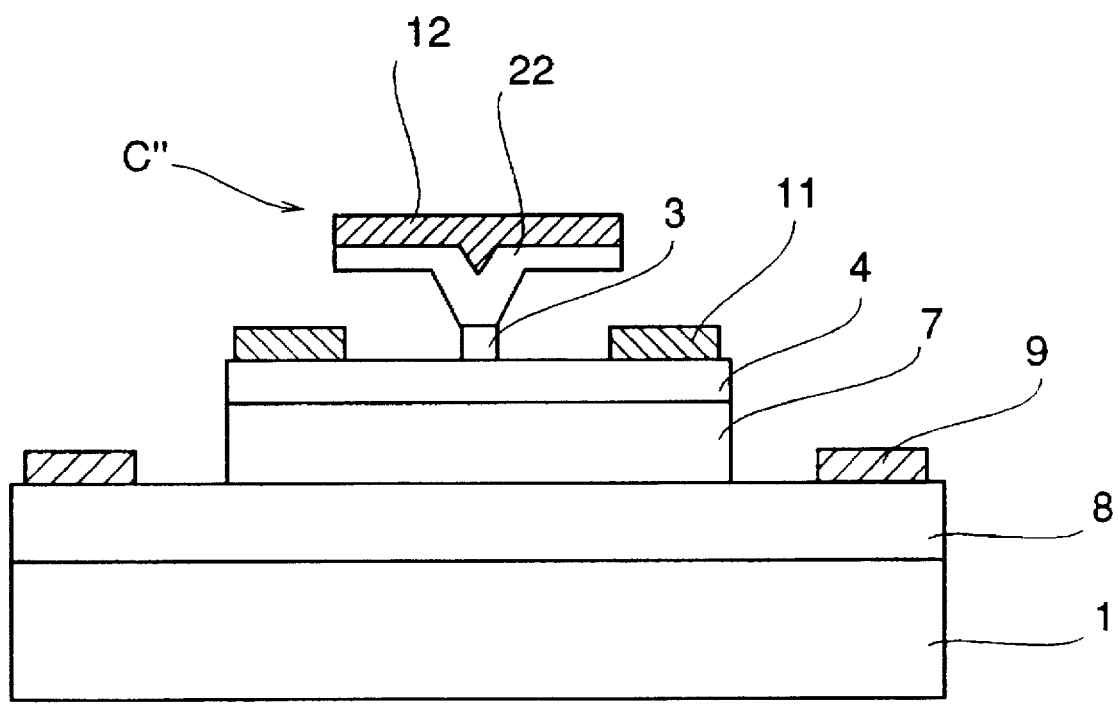
FIG. 11 is a sectional view illustrating an HBT according to a sixth embodiment of the present invention.

FIG. 11 is a cross-sectional view illustrating an HBT according to a sixth embodiment of the present invention. In FIG. 11, the same reference numerals as in FIG. 5 designate the same or corresponding parts, and the physical parameters, such as composition and thickness, are the same as those described with respect to FIG. 5.

In the above-described third embodiment of the invention, emphasis has been placed upon a structure including an emitter layer at the top of the laminated semiconductor layers. In this sixth embodiment, a similar HBT structure including a collector contact layer at the top of the laminated structure will be described. In FIG. 11, reference character C" designates a collector structure comprising an n type GaAs collector layer 3, an n type InGaAs collector contact layer 22, and a collector electrode 12.

The fabrication process of the HBT shown in FIG. 11 is illustrated in FIGS. 12(a)–12(g). The process steps shown in FIGS. 12(a)–12(g) are fundamentally identical to the process steps according to the third embodiment shown in FIGS. 6(a)–6(g) except that the emitter structure E" is interchanged with the collector structure C".

Figure 12:
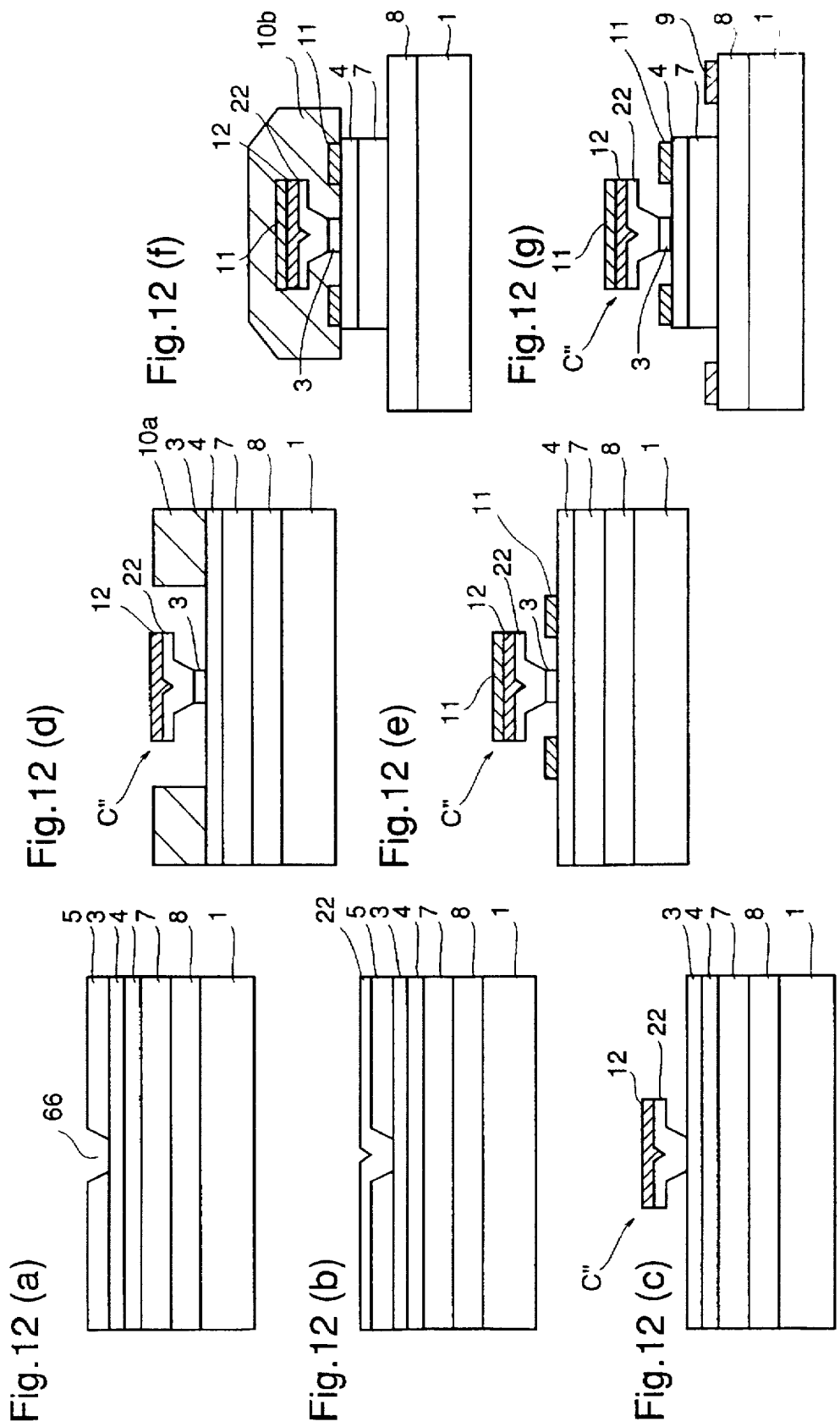
FIGS. 12(a)–12(g) are sectional views illustrating process steps in a method of fabricating the HBT of FIG. 11.
Figure 13:
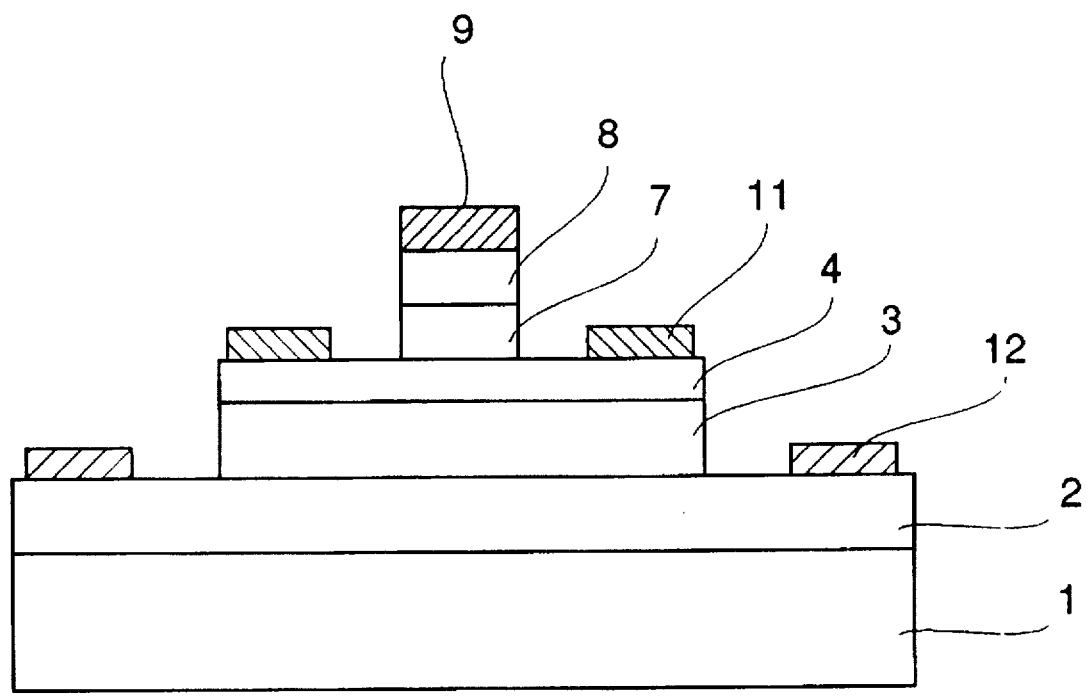
FIG. 13 is a sectional view illustrating an HBT according to the prior art.

Initially, as illustrated in FIG. 12(a), an emitter contact layer 8, an emitter layer 7, a based layer 4, a collector layer 3, and a crystalline mask layer 5 are successively grown on a semi-insulating GaAs substrate 1 by MOCVD. The mask layer 5 comprises AlGaAs having a relatively high Al composition ratio. In this case, the Al composition ratio is 0.5. Then, an opening 66 having a width of 2 µm is formed using a mask layer 5 by photolithography and wet etching with a hydrofluoric acid based etchant. This etching may be a dry etching.

In the step of FIG. 12(b), a collector contact layer 22 is grown over the entire surface of the wafer by MOCVD so that the collector contact layer 22 contacts the collector layer 3 at the bottom of the opening 66 of the mask layer 5.

In the step of FIG. 12(c), a collector electrode 12 having a prescribed area is formed on the collector contact layer 22 and, using the collector electrode 12 as a mask, the collector contact layer 22 and the mask layer 5 are selectively etched with a tartaric acid or citric acid based etchant. If the mask layer 5 comprises an insulating film, the collector contact layer 22 grown on the insulating mask layer is converted into a polycrystalline layer, so that the resistance of the collector contact layer 22 is unfavorably increased. In this case, the collector resistance cannot be reduced, and the precision in patterning of the mask layer is reduced. In this sixth embodiment of the invention, however, since a crystalline film is used as the mask 5, a monocrystalline collector contact layer is grown thereon.

Thereafter, as illustrated in FIG. 12(d), a resist pattern 10a having an opening in a region where the T-shaped collector structure C" is present and based electrodes are to be formed is formed on the based layer 4 by photolithographic techniques.

In the step of FIG. 12(e), a based metal is deposited using the resist pattern 10a and the T-shaped collector structure C" as masks, and the resist pattern 10a and unnecessary portions of the based metal on the resist pattern 10a are removed by the lift-off technique, whereby based electrodes 11 are fabricated.

Thereafter, as illustrated in FIG. 12(f), a resist pattern 10b is formed on the based layer 4, covering the collector structure C" and the based electrodes 11. Using the resist pattern 10b as a mask, the based layer 4 and the emitter layer 7 are selectively etched. Then, as illustrated in FIG. 12(g), a metal is deposited using the resist pattern 10b as a mask, and the resist pattern 10b and unnecessary portions of the metal on the resist pattern 10b are removed by the lift-off technique, thereby forming emitter electrodes 9.

In an HBT according to this sixth embodiment of the invention, since the collector structure C" has a T-shaped cross-section, the contact area of the collector electrode 12 and the collector contact layer 22 is larger than the junction area of the collector contact layer 22 and the based layer 4, resulting in an HBT with reduced contact capacitance and reduced collector resistance.

Further, the HBT is easily fabricated according to the process steps shown in FIGS. 12(a)–12(g).

While using a above-described first to sixth embodiments emphasis has been placed upon an HBT including a GaAs substrate, a similar structure including an InP substrate, an n type InGaAs collector layer, a p type InGaAs based layer, and an n type InP or InAlAs emitter layer is also within the scope of the present invention.

Although using a above-described embodiments emphasis has been placed upon an HBT including an n type collector layer, an n type emitter layer, and a p type based layer, an HBT including a p type collector layer, a p type emitter layer, and an n type based layer is also within the scope of the present invention.

Furthermore, the structure and the fabrication method of the present invention may be applied to HBTs comprising compound semiconductors, such as InGaAsSb or InGaAsP, or HBTs comprising SiGe or SiC.

Further, the structure and the fabrication method according to the present invention may be applied to bipolar transistors gernerally.

What is claimed is:

1. A method of fabricating a bipolar transistor comprising:
    successively growing a collector layer, a based layer, and a crystalline mask layer on a semiconductor substrate;
    forming an opening using a crystalline mask layer to expose a portion of the based layer;
    growing an emitter layer on the crystalline mask layer and on the based layer exposed using a opening of the mask layer;
    forming an emitter electrode on the emitter layer;
    removing part of the emitter layer using the emitter electrode as a mask;
    removing the crystalline mask layer;
    forming a first resist pattern for formation of based electrodes;
    forming based electrodes using the first resist pattern and the emitter electrode as masks;
    removing the first resist pattern;
    forming a second resist pattern for formation of collector electrodes covering the based electrodes and the emitter electrode;
    using the second resist pattern as a mask, removing portions of the based layer and the collector layer; and
    forming collector electrodes in contact with the collector layer.

2. The method of claim 1 wherein said bipolar transistor is a heterojunction bipolar transistor.

3. A method of fabricating a bipolar transistor comprising:
    successively growing a collector layer, a based layer, a first emitter layer, and a crystalline mask layer on a semiconductor substrate;
    forming an opening using a crystalline mask layer to expose a portion of the first emitter layer;
    growing a second emitter layer on the crystalline mask layer and on the first emitter layer exposed using a opening of the mask layer;
    forming an emitter electrode on the second emitter layer;
    removing parts of the second and first emitter layers using the emitter electrode as a mask;
    removing the crystalline mask layer;
    forming a first resist pattern for formation of based electrodes;
    forming based electrodes using the first resist pattern and the emitter electrode as masks;
    removing the first resist pattern;
    forming a second resist pattern for formation of collector electrodes covering the based electrodes and the emitter electrode;
    using the second resist pattern as a mask, removing portions of the based layer and the collector layer; and
    forming collector electrodes in contact with the collector layer.

4. The method of claim 3 wherein said bipolar transistor is a heterojunction bipolar transistor.

5. A method of fabricating a bipolar transistor comprising:
    successively growing a collector layer, a based layer, an emitter layer, and a crystalline mask layer on a semiconductor substrate;
    forming an opening crystalline mask layer to expose a portion of the emitter layer;
    growing an emitter contact layer on the crystalline mask layer and on the emitter layer exposed in the opening of the mask layer;
    forming an emitter electrode on the emitter contact layer;
    removing part of the emitter contact layer using the emitter electrode as a mask;
    removing the crystalline mask layer;
    forming a first resist pattern for formation of based electrodes;
    forming based electrodes using the first resist pattern and the emitter electrode as masks;
    removing the first resist pattern;
    forming a second resist pattern for formation of collector electrodes covering the based electrodes and the emitter electrode;
    using the second resist pattern as a mask, removing portions of the base layer and the collector layer; and
    forming collector electrodes in contact with the collector layer.

6. The method of claim 5 wherein said bipolar transistor is a heterojunction bipolar transistor.

7. A method of fabricating a bipolar transistor comprising:
    successively growing an emitter layer, a based layer, and a crystalline mask layer on a semiconductor substrate;
    forming an opening using a crystalline mask layer to expose a portion of the based layer;

growing a collector layer on the crystalline mask layer and on the based layer exposed using a opening of the mask layer;

forming a collector electrode on the collector layer;

removing part of the collector layer using the collector electrode as a mask;

removing the crystalline mask layer;

forming a first resist pattern for formation of based electrodes;

forming based electrodes using the first resist pattern and the collector electrode as masks;

removing the first resist pattern;

forming a second resist pattern for formation of emitter electrodes covering the based electrodes and the collector electrode;

using the second resist pattern as a mask, removing portions of the based layer and the emitter layer; and forming emitter electrodes in contact with the emitter layer.

8. The method of claim 7 wherein said bipolar transistor is a heterojunction bipolar transistor.

9. A method of fabricating a bipolar transistor comprising:

successively growing an emitter layer, a based layer, a first collector layer, and a crystalline mask layer on a semiconductor substrate;

forming an opening using a crystalline mask layer to expose a portion of the first collector layer;

growing a second collector layer on the crystalline mask layer and on the first collector layer exposed using a opening of the mask layer;

forming a collector electrode on the second collector layer;

removing parts of the second and first collector layers using the collector electrode as a mask;

removing the crystalline mask layer;

forming a first resist pattern for formation of based electrodes;

forming based electrodes using the first resist pattern and the collector electrode as masks;

removing the first resist pattern;

forming a second resist pattern for formation of emitter electrodes covering the based electrodes and the collector electrode;

using the second resist pattern as a mask, removing portions of the based layer and the emitter layer; and forming emitter electrodes in contact with the emitter layer.

10. The method of claim 9 wherein said bipolar transistor is a heterojunction bipolar transistor.

11. A method of fabricating a bipolar transistor comprising:

successively growing an emitter layer, a based layer, a collector layer, and a crystalline mask layer on a semiconductor substrate;

forming an opening using a crystalline mask layer to expose a portion of the collector layer;

growing a collector contact layer on the crystalline mask layer and on the collector layer exposed using a opening of the mask layer;

forming a collector electrode on the collector contact layer;

removing part of the collector contact layer using the collector electrode as a mask;

removing the crystalline mask layer;

forming a first resist pattern for formation of based electrodes;

forming based electrodes using the first resist pattern and the collector electrode as masks;

removing the first resist pattern;

forming a second resist pattern for formation of emitter electrodes covering the based electrodes and the collector electrode;

using the second resist pattern as a mask, removing portions of the based layer and the emitter layer; and forming emitter electrodes in contact with the emitter layer.

12. The method of claim 11 wherein said bipolar transistor is a heterojunction bipolar transistor.

* * * * *